United States Patent
Brandt et al.

(10) Patent No.: US 9,601,814 B2
(45) Date of Patent: Mar. 21, 2017

(54) BATTERY MAINTENANCE ALERT DEVICE AND PROCESS

(75) Inventors: Gregory William Brandt, Sullivan, IL (US); Bruce Eugene Bushert, Maroa, IL (US)

(73) Assignee: USA Clean, Inc., Decatur, IL (US)

( * ) Notice: Subject to any disclaimer, the term of this patent is extended or adjusted under 35 U.S.C. 154(b) by 835 days.

(21) Appl. No.: 13/461,116

(22) Filed: May 1, 2012

(65) Prior Publication Data

US 2013/0009782 A1 Jan. 10, 2013
US 2016/0156073 A9 Jun. 2, 2016

Related U.S. Application Data

(60) Provisional application No. 61/571,291, filed on Jun. 24, 2011.

(51) Int. Cl.
| | |
|---|---|
| *G08B 21/00* | (2006.01) |
| *H01M 10/48* | (2006.01) |
| *H01M 10/06* | (2006.01) |
| *H01M 10/42* | (2006.01) |
| *G08B 21/18* | (2006.01) |
| *G01R 31/36* | (2006.01) |

(52) U.S. Cl.
CPC .......... *H01M 10/48* (2013.01); *G08B 21/182* (2013.01); *H01M 10/06* (2013.01); *H01M 10/4207* (2013.01); *G01R 31/3689* (2013.01)

(58) Field of Classification Search
CPC . G08B 21/00; G08B 3/00; G08B 5/00; G08B 21/18; G08B 21/182; G08B 23/00; G01R 31/36; G01R 31/3606; G01R 31/3668; G01R 31/3682; G01R 31/3686; G01R 31/3689; H01M 6/5044; H01M 6/505; H01M 6/5061; H01M 10/06; H01M 10/42; H01M 10/48; H01M 10/488; H01M 10/4207
USPC ........ 340/635, 636.1–636.21, 657, 659, 660, 340/661, 662, 663, 664; 320/103; 707/609, 618, 661, 689, 694, 702
See application file for complete search history.

(56) References Cited

U.S. PATENT DOCUMENTS

| | | | | |
|---|---|---|---|---|
| 4,673,826 | A | * | 6/1987 | Masson ........................... 307/66 |
| 4,692,680 | A | * | 9/1987 | Sherer ........................... 320/103 |
| 4,723,536 | A | * | 2/1988 | Rauscher et al. ............... 600/14 |
| 4,747,035 | A | * | 5/1988 | Bobry ............................. 363/24 |
| 5,250,904 | A | * | 10/1993 | Salander et al. ............... 324/430 |
| 5,311,116 | A | * | 5/1994 | Rogers ........................... 324/72.5 |
| 6,252,373 | B1 | * | 6/2001 | Stefansson et al. ........... 320/106 |
| 8,078,415 | B2 | | 12/2011 | Rajagopalan et al. |
| 8,078,416 | B2 | | 12/2011 | Iwane et al. |
| 8,078,417 | B2 | | 12/2011 | Ishishita |
| 2005/0001627 | A1 | * | 1/2005 | Anbuky et al. ................ 324/427 |
| 2005/0206388 | A1 | * | 9/2005 | Quint et al. ................... 324/430 |
| 2007/0182576 | A1 | * | 8/2007 | Proska ............... G01R 31/3624 340/636.1 |
| 2007/0229032 | A1 | * | 10/2007 | Elder et al. .................... 320/132 |
| 2009/0150818 | A1 | * | 6/2009 | Bakhreiba et al. ........... 715/771 |

(Continued)

*Primary Examiner* — Brian Wilson (74) *Attorney, Agent, or Firm* — Singleton Law Firm, P.C.

(57) ABSTRACT

The invention provides a battery maintenance alert process and device capable of tracking one or more operational variables for a lead-acid battery and lead-acid battery-operated equipment and alerting the user of the battery or battery-operated equipment when it is time to perform battery maintenance or service.

1 Claim, 4 Drawing Sheets

(56) References Cited

U.S. PATENT DOCUMENTS

| | | | |
|---|---|---|---|
| 2009/0315510 A1* | 12/2009 | Dos Santos | 320/107 |
| 2010/0114512 A1* | 5/2010 | Cotton et al. | 702/63 |
| 2010/0121588 A1* | 5/2010 | Elder | H01M 10/48 |
| | | | 702/63 |
| 2010/0194576 A1* | 8/2010 | Bertness | 340/636.1 |
| 2010/0244566 A1* | 9/2010 | Spitaels et al. | 307/66 |
| 2010/0312605 A1* | 12/2010 | Mitchell et al. | 705/9 |
| 2012/0091971 A1* | 4/2012 | Syed | B60L 11/1851 |
| | | | 320/162 |
| 2012/0139475 A1* | 6/2012 | Evans | H02J 7/044 |
| | | | 320/106 |

\* cited by examiner

BATTERY MAINTENANCE ALERT DEVICE AND PROCESS

CROSS-REFERENCE TO RELATED APPLICATION

This application claims the benefit of U.S. provisional patent application Ser. No. 61/571,921, filed on Jun. 24, 2011, the contents of which are incorporated by reference herein in their entirety.

BACKGROUND

Evaporation of electrolyte from wet cell batteries can lead to premature damage to the batteries. For various reasons, equipment that uses wet cell batteries are generally poorly maintained, resulting in shorter battery life. The biggest cause of premature battery failure is negligent maintenance, specifically, improperly maintained fluid levels in each battery cell.

A common method for preventing premature battery failure is proactive inspection of the fluid levels in batteries. Since drying or evaporation below the tops of the lead plates can lead to irreversible damage, reactive inspection and maintenance do not improve battery life. Thus, this method has limited effectiveness as the equipment user may not remember to inspect fluid level or know when fluids need to be added.

Another method for preventing premature battery failure involves the automatic electronic monitoring of a single battery cell in a battery pack. Since each battery pack will have a significant number of individual cells, monitoring the water level of a single cell is not indicative of the water level in the other cells.

Other methods exist for measuring specific electrical conditions of the batteries that are based on historical data and specialized algorithms. These methods are generally designed for a very specific battery type and model and can be subject to false readings that are not necessarily related to the battery. A poorly performing battery charger is one such example.

SUMMARY OF THE INVENTION

The invention provides a lead-acid battery maintenance alert system that can be used to alert an equipment user to the need for inspection and maintenance of a lead-acid battery.

The invention enables the equipment user to take a proactive approach to battery maintenance. It does not require the user to remember to check and maintain the battery fluid level.

A battery maintenance alert device of the invention can be used to monitor and/or track one or more operational variables such as, without limitation, calendar time, battery use time and charge cycles, and at a preselected time, alert the equipment user to inspect and perform maintenance on the batteries. In addition, after a preset threshold has been reached, the device can disable the battery-operated machine or equipment until the check and maintenance of the battery has been completed. The device can be programmed to incorporate a warning period prior to the disabling function. The battery-operated machine or equipment can be enabled again via a certain predetermined process, for example by pressing a button on the device is a specific sequence. This can be done, with the addition of a relay, connected to the device and installed between the battery pack and the machine. The device will sent a signal to the relay triggering it to disconnect power from the battery pack.

Additional capabilities of a device of the invention include, for example, the ability to output various types of historical data such as, without limitation, the number batteries installed, battery use time, total calendar time, maintenance history and charge cycle.

In one aspect, the invention provides a lead-acid battery maintenance alert process that involves the steps of:
providing an automated battery maintenance alert device for a lead-acid battery or a lead-acid battery-operated equipment, the device being capable of (i) tracking one or more operational variables of the battery or battery-operated equipment, (ii) generating an alert when the one or more operational variables has reached a preselected threshold value, and (iii) receiving input that resets one or more operational variables on the device;
providing a system for entering information into a database, the database includes identifying information and associated installation information and service event information for a plurality of lead-acid batteries or lead-acid battery-operated equipments;
determining whether installation information or updated service event information for a lead-acid battery or lead-acid battery-operated equipment has been entered into the database by a preselected time; and
sending a notification to a user that no installation information or updated service event information has been entered into the database for the battery or battery-operated equipment if the installation information or updated service event information has not been entered by the preselected time.

In some embodiments, the process relates to a deep-cycled lead-acid battery or a valve-regulated lead acid battery. In some embodiments, the one or more operational variables are calendar time, usage hours, charge cycle or any combination thereof. In some embodiments, the preselected threshold value or preselected time is determined based on battery type. In some embodiments, the one or more operational variables include calendar time and the preselected threshold value is 30 days, 60 days, 90 days, 120 days, 150 days, 180 days, or 210 days. In some embodiments, the one or more operational variables include battery use time and the preselected threshold value is 30 hours, 60 hours, 90 hours, 120 hours, 150 hours, 180 hours or 210 hours. In some embodiments, the one or more operational variables include charge cycle and the preselected threshold value is 3, 5, 7, 9, 12, 15, 30, 60, 120 charge cycles.

In some embodiments, the automated battery maintenance alert device has a database component operative to maintain a database containing one or more operational variables of a lead-acid battery or lead-acid battery-operated equipment, a processor operative to continuously track the one or more operational variables when the device is connected to the battery, and a feedback component under the control of the processing component that is operative to alert the user of the battery or battery-operated equipment that one or more operational variables is near, has reached or has surpassed a select threshold value. In some embodiments, the system for entering information into said database is an automated telephone system or a web-based electronic submission system. In some embodiments, the identifying information further includes identifying information for a battery maintenance alert device associated with the battery or battery-operated equipment. In some embodiments, the associated service event information includes the date of battery installation, the date of one or more service events or a combination thereof. In some embodiments, the preselected time is 60 days to 1000 days after the previous service event information update. In some embodiments, the preselected time is 60 days, 90 days, 120 days, 150 days, 180 days, 210 days, 240 days, 270 days, 300 days, 330 days, 360 days, 390 days, 420 days, 450 days, 480 days, 510 days, 540 days, 570 days, 600 days, 630 days, 660 days, 690 days, 720 days, 750 days, 780 days, 810 days, 840 days, 870 days, 900 days, 930 days, 960 days or 990 days after the previous service event information update.

In some embodiments of a process of the invention, the user is notified using a computerized notification system. In some embodiments, the user is notified using a computerized notification system such as a phone calling system, text messaging system, auto email messaging system, or any combination thereof. In some embodiments, the alert is a continuous or pulsing auditory signal. In some embodiments, the auditory signal is a continuous or pulsing sound generated by an electronic or mechanical component. In some embodiments, the alert is a steady or flashing visual signal. In some embodiments, the visual signal is a steady or flashing light, a lit text based display, a lit graphical display, or any combination thereof. In some embodiments, the alert includes auditory information conveyed by a computer generated voice, text information provided on a text user interface or graphical user interface, or a combination thereof.

In another aspect, the invention provides a computerized battery maintenance alert process that involves maintaining an electronic database having identifying information and associated installation and service event information for a plurality of lead-acid batteries or lead-acid battery-operated equipments; determining whether installation information, or updated service event information, for a battery or battery-operated equipment has been entered into the database by a preselected time; and controlling a user notification system to notify the user if the installation information, or updated service event information, has not been entered into the database by the preselected time. In some embodiments, the battery is a deep-cycled lead-acid battery or a valve-regulated lead acid battery. In some embodiments, the identifying information further includes identifying information for a battery maintenance alert device associated with the battery or battery-operated equipment. In some embodiments, the identifying information includes a serial number for the battery or battery-operated equipment, a serial number for a battery maintenance alert device associated with the battery or battery-operated equipment, or a combination thereof. In some embodiments, the associated service event information includes the date of battery installation, date of one or more service events or a combination thereof. In some embodiments, the preselected time is 60 days to 1000 days after the previous service event information update. In some embodiments, the preselected time is 60 days, 90 days, 120 days, 150 days, 180 days, 210 days, 240 days, 270 days, 300 days, 330 days, 360 days, 390 days, 420 days, 450 days, 480 days, 510 days, 540 days, 570 days, 600 days, 630 days, 660 days, 690 days, 720 days, 750 days, 780 days, 810 days, 840 days, 870 days, 900 days, 930 days, 960 days or 990 days after the previous service event information update. In some embodiments, the user notification system is an automated phone calling system, an automated text messaging system, an automated email messaging system or any combination thereof. In some embodiments, process further involves providing information to the user related to the maintenance or service of the battery or battery-operated equipment.

In another aspect, the invention provides a computer-readable medium having computer-executable instructions for performing a computerized battery maintenance alert process.

In another aspect, the invention provides an article of manufacture which is a computer-readable medium having stored thereon a data structure, a first field containing data representing an operational variable of a battery or battery-operated equipment, a second field containing data representing a preselected threshold value for an operational variable, and a third field containing data representing the difference between the first field and the second field.

In another aspect, the invention provides a battery maintenance alert device that has a database component operative to maintain a database containing one or more operational variables of a battery or battery-operated equipment, a processor operative to continuously track one or more operational variables when the device is connected to the battery, and a feedback component under the control of the processing component that is operative to alert the user of the battery or battery-operated equipment that one or more operational variables is near, has reached or has surpassed a preselected threshold value. In some embodiments, the battery maintenance alert device further includes a voltage regulation component operative to receive power from the battery and supply a stable voltage to the battery maintenance device when the device is connected to the battery. In some embodiments, the voltage regulation component is a 3.3V, 5 V or a + or −36 V DC regulator. In some embodiments, the processor includes one or more timers. In some embodiments, the processor includes a component operative to convert an analog signal received from the battery to a digital signal. In some embodiments, the processor includes a controller operative to control signal output from the processor to the feedback component. In some embodiments, the processor is programmed to continuously determine whether the battery is idle, in use or in a charge cycle when the device is connected to the battery. In some embodiments, the processor utilizes signal input from two shunts attached to the battery to determine whether the battery is idle, in use or in a charge cycle. In some embodiments, the processor utilizes signal input from a floating shunt to determine whether the battery is idle, in use or in a charge cycle. In some embodiments, the processor is programmed to continuously compute one or more operational variables of the battery or battery-operated equipment, maintain in the database component a database of one or more operational variables for any given time, and provide on the feedback component an output indicating whether the one or more operational variables is near, has reached or has surpassed a preselected threshold value. In some embodiments, the user feedback component generates an auditory signal. In some embodiments, the auditory signal is an electronically-generated sound, mechanically-generated sound, information conveyed by a computer-generated voice or a combination thereof. In some embodiments, the user feedback component includes a light indicator. In some embodiments, the light indicator is one capable of generating a flashing light. In some embodiments, the user feedback component includes a text user interface. In some embodiments, the user interface allows a user to enter service event information for the battery or battery-operated equipment. In some embodiments, the service event information includes information pertaining to whether any diagnosis, maintenance, repair or any combination thereof has been performed on the battery. In some embodiments, the service event information includes the date on which any diagnosis, maintenance, repair or any combination thereof was performed on the battery. In some embodiments, the user feedback component includes a graphical user interface. In some embodiments, the user interface allows a user to enter service event information for the battery or battery-operated equipment. In some embodiments, the service event information includes information pertaining to whether any diagnosis, maintenance, repair or any combination thereof has been performed on the battery and if so, the date on which the diagnosis, maintenance, repair or any combination thereof was performed. In some embodiments, the user feedback component includes a text or graphical user interface that provides information pertaining to one or more operational variable of the battery or battery-operated equipment. In some embodiments, the one or more operational variables includes calendar time since the date of battery installation, calendar time since the last service event, cumulative battery use time since the date of battery installation or date of last service event, number of charge cycles since the date of battery installation date of last service event, or any combination thereof. In some embodiments, the calendar time since the date of battery installation or time since the last service event is determined in number of days. In some embodiments, the cumulative battery use time is determined in number of hours. In some embodiments, if the one or more operational variables includes calendar time since the date of battery installation, or calendar time since the last service event, then the preselected value for the time since the date of battery installation, or time since the last service event, can be 30 days, 60 days, 90 days, 120 days, 150 days, 180 days or 210 days. In some embodiments where the one or more operational variables includes cumulative battery use time since the date of battery installation or date of last service event, the preselected value for the cumulative battery use time can be 30 hours, 60 hours, 90 hours, 120 hours, 150 hours, 180 hours or 210 hours. In some embodiments, where the one or more operational variables includes number of charge cycles since the date of battery installation or date of last service event, the preselected value for number of charge cycles since the date of battery installation or date of last service event can be 3, 5, 7, 9, 12, 15, 30, 60, 120 charge cycles.

In a battery maintenance alert device having a text or graphical user interface including a display and a selection device, the invention provides a method of providing and selecting from a menu on the display, the method involving retrieving a set of menu entries for the menu, the menu entries representing the day, month, year or any combination thereof of a battery installation or a service event, displaying the set of menu entries on the display, receiving one or more menu entry selection signals indicative of the selection device pointing at one or more selected menu entries of the set of menu entries, and in response to the one or more signals, entering the one or more menu entry selections into a database.

Any feature or combination of features described herein are included within the scope of the present invention provided that the features included in any such combination are not mutually inconsistent as will be apparent from the context, this specification and the knowledge of one of ordinary skill in the art.

Unless otherwise defined, all technical and scientific terms used herein have the same meaning as commonly understood by one of ordinary skill in the art to which this invention belongs. In case of conflict, the present specification, including definitions, will control. In addition, the materials, methods, and examples are illustrative only and not intended to be limiting. Although methods and materials similar or equivalent to those described herein can be used to practice the invention, suitable methods and materials are described below.

All patents and publications referenced or mentioned herein are indicative of the levels of skill of those skilled in the art to which the invention pertains, and each such referenced patent or publication is hereby incorporated by reference to the same extent as if it had been incorporated by reference in its entirety individually or set forth herein in its entirety. Applicants reserve the right to physically incorporate into this specification any and all materials and information from any such cited patents or publications.

Other features and advantages of the invention will be apparent from the following detailed description and from the claims.

DETAILED DESCRIPTION OF THE INVENTION

The invention relates to tracking one or more operational variables of a lead-acid battery or lead-acid battery-operated equipment in order to provide information related to battery use and/or maintenance needs. The invention provides a battery maintenance alert process and device that can be employed to track one or more operational variables of a lead-acid battery or battery-operated equipment and alert the user of the battery or battery-operated equipment to service the battery when one or more operational variables of the battery or battery-operated equipment has reached preselected threshold values, i.e values that have been predetermined and programmed into the device.

In one aspect, the invention provides a battery maintenance alert process that involves providing an automated battery maintenance alert device for a lead-acid battery or lead-acid battery-operated equipment; providing a system for entering information into a database that includes identifying information for a plurality of lead-acid batteries or lead-acid battery-operated equipments and associated installation and service event information for the plurality of batteries or battery-operated equipments; determining whether installation information or updated service event information for a battery or battery-operated equipment has been entered into the database by a preselected time; and if installation information or updated service event information has not been entered by the preselected time, then sending a notification to the user that no installation information or updated service event information has been entered for the battery or battery-operated equipment.

In another aspect, the invention provides a computerized battery maintenance alert process that involves maintaining an electronic database of identifying information and associated installation and service event information for a plurality of lead-acid batteries or lead-acid battery-operated equipments, determining whether the installation information or an updated service event information for a battery or battery-operated equipment has been entered by a preselected time, and controlling a user notification system to notify the user of the lead-acid battery or lead-acid battery operated equipment if the installation information or updated service event information has not been entered by the preselected time.

In another aspect, the invention provides an article of manufacture that includes a computer-readable medium having a data structure, a first field having data representing an operational variable of a lead-acid battery or lead-acid battery-operated equipment, a second field containing data representing a preselected threshold value for an operational variable and a third filed containing data representing the difference between the first and second fields.

In another aspect, the invention provides a lead-acid battery maintenance alert device that includes a database component that maintains a database of one or more operational variables of a lead-acid battery or lead-acid battery-operated equipment, a processor that continuously computes and tracks one or more operational variables when connected to the battery, and a feedback component under the control of the processor that can alert the user when one or more operational variables is near, has reached or has surpassed a preselected threshold.

In another aspect, the invention provides a battery maintenance alert device having a text user interface or graphical user interface that includes a display and a selection device, as well as a method for providing and selecting from a menu on such a display that includes retrieving a set of menu entries for the menu, the menu entries representing the day, month, year, or any combination thereof of a battery installation or service event; displaying the set of menu entries on the display; receiving one or more menu entry selection signals indicative of the selection device pointing at one or more selected menu entries; and entering the one or more menu entry selections into a database.

Battery Maintenance Alert Device

In one aspect, the invention provides a battery maintenance alert device having a database component, a processor and a feedback component.

Database Component

The database component is used to maintain a database of one or more operational variables of a lead-acid battery or lead-acid battery-operated equipment. An operational variable of a battery or battery-operated equipment can be, for example, calendar time since battery installation, calendar time since the previous service event on the battery, battery use time, or charge cycle on the battery. Time can be measure in seconds, minutes, hours, days, weeks, months, years, any other useful measure of time, or any combination thereof.

Calendar time since battery installation can be time since the battery was installed in the battery-operated equipment or time since the battery and battery-operated equipment is first put into use for its intended purpose. Similarly, calendar time since a previous service event can be time since any diagnostic, maintenance or repair work is performed on the battery itself or time since any diagnostic, maintenance or repair work is performed on the battery-operated equipment that relates to the function or efficiency of the battery for example. Thus, as used herein, the term "service event" refers to any work on the battery-operated equipment that relates to the function or efficiency of the lead-acid battery, or any work on the battery itself, performed for a diagnostic, maintenance or repair purpose. Calendar time can be monitored using a timer internal to the embedded processor.

Battery use time refers to time that the battery has been discharging or that the battery-operated equipment has been in use since a select event or within a select time period. The select event can be, for example, battery installation, the previous service event on the battery, the previous service event performed on the battery-operated equipment that relates to the function or efficiency of the battery, or the previous reset of a device of the invention. Battery use can be determined by detecting the discharge of current, and battery use time is a cumulative figure reflecting the total time that current has been discharging in a select time period or since a select event. Current can be determined using any methods known to those of skill in the art including, for example, using a resistive shunt in series with one or more batteries. In this case, current can be determined by the processor using the known resistance of the shunt in combination with the voltage generated across the shunt when current begins to flow. Voltage can be detected using an analog-to-digital converter in the processor. Thus, battery use time can be determined by recording the duration of a current discharge and maintaining a cumulative count of the battery use time since a particular event or within a particular time period. For example, if the battery or battery-operated equipment was in use 10 hours a day every day since the previous service event on the battery, which occurred 90 days ago, then the battery use time is 900 hours.

Charge cycle is measured as one or more discrete events, in which one charge cycle is a reversal of the direction of current relative to the direction of current observed when the battery is discharging during use. Thus, two, three or four charge cycles, for example, indicate that there have been two, three or four reversals of current direction relative to the current observed when the battery discharges, respectively. Current can be determined using any methods known to those of skill in the art. For example, current can be determined by a processor using a resistive shunt in combination with an analog-to-digital converter as described above. The direction of current can be determined using two resistive shunts and an analog-to-digital converter with dual channels as exemplified in FIG. 1. In this case, the signals from one shunt and channel sense current being discharged from the battery and the signals from the other resistor and channel sense current in the reverse direction indicating that the battery is being charged. This method utilizes a single, low-cost, uni-polar voltage reference. As a result the A/D's are uni-polar and requires an offset ground reference between the two resistive shunts. As such, the magnitude and direction of current can be tracked so that a charge cycle is recorded with each reversal of current.

The database can also include identifying information for a battery maintenance alert device, as well as a battery or battery-operated equipment to which the device is attached and with which the above operational variables are associated. Identifying information can be the serial number for the battery maintenance alert device or for the battery and/or battery-operated equipment, or any numeric, alphabetical or alpha-numeric designation that is unique to, a battery maintenance alert device, a battery, battery-operated equipment, or user of the battery or battery-operated equipment. The user can be the owner or actual user or operator of the battery maintenance alert device, battery or battery-operated equipment, as well as their agent or the person overseeing the operation of the battery maintenance alert device, battery or battery-operated equipment.

The operational variables and identifying information for a battery maintenance alert device, battery or battery-operated equipment are associated in the database so that the data pertaining to each battery maintenance alert device, battery or battery-operated equipment can be retrieved using one or more identifying information.

The database can also include preselected threshold values for one or more operational variables. Preselected threshold values for calendar time or battery use time can be in seconds, minutes, hours, days, weeks, months, year or any combination thereof. Preselected threshold values can be specific to the battery type or size. A preselected threshold value for calendar time can be, without limitation, 30 days, 60 days, 90 days, 120 days, 150 days, 180 days, or 210 days. A preselected threshold value for battery use time can be, without limitation, 30 hours, 60 hours, 90 hours, 120 hours, 150 hours, 180 hours or 210 hours. A preselected threshold value for charge cycle can be, without limitation, 3, 5, 7, 9, 12 or 15 charge cycles.

Processor

The processor is used to track, i.e. continuously compute, one or more operational variables when the battery maintenance alert device is connected to the battery. The processor includes one or more timers, a controller, and software to continuously compute one or more operational variables of a battery or battery-operated equipment. The processor can optionally include a component that can convert an analog signal received from a shunt to a digital signal such as an analog-to-digital converter.

The one or more timers in the processor can be used to track the passage of total time since activation, as well as trigger the reading of the analog-to-digital converters on a periodic basis to allow for proper integration of the signal for noise reduction.

Figure 1:
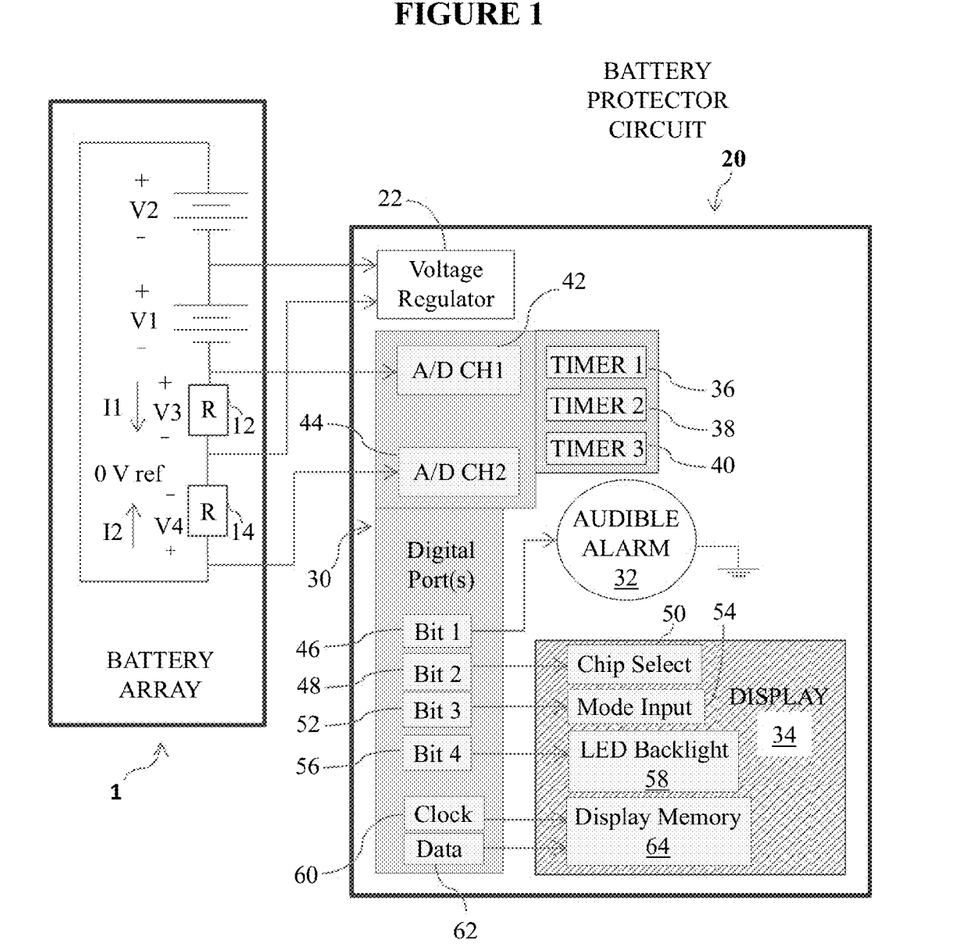
FIG. 1 is a block diagram illustrating the configuration of the battery maintenance alert device 20, an exemplary embodiment of the invention. The battery maintenance alert device 20 is attached to battery 1.

The controller can include digital ports for controlling signal output from the processor to one or more components of a device of the invention. The controller can have a port for controlling a feedback component capable of generating an auditory signal such as an alarm or an electric buzzer. The controller can have one or more ports for controlling a feedback component capable of generating a visual signal such as a light. The controller can also have one or more ports for controlling a feedback component such as a text user interface or a graphical user interface. In this case, the controller can have one or more ports for controlling various components of a display such as, for example, a LCD back light, a display memory, a mode input or a chip select. Thus, the controller can have a digital port for controlling signal output from the processor to an audible alarm and additional digital ports for controlling signal output from the processor to the chip select, mode input, LED backlight and display memory of a display as shown in FIG. 1.

The processor can also include a component such as an analog-to-digital converter for converting an analog signal from the battery to a digital signal. The analog-to-digital converter can have two channels, which can be used with two shunts, for determining the direction of current flow in the battery as shown in FIG. 1, for example. The utilization of two shunts in series produces an artificially offset ground reference point. By having the voltage regulator utilize this point as electrical ground, the entire system sees this as ground, including the analog-to-digital (A/D) converters. As the current flows into the batteries during a charge cycle, a current $I1$ produces a voltage $V3$ across the shunt. Channel 1 of the A/D using this point as a ground input measures a positive voltage generated across the shunt of known value and computes the value of current flow. When the current flows out of the battery during a discharge cycle, the current $I2$ produces a voltage $V4$ across the other shunt. Channel 2 of the A/D, using the artificial ground reference point can now measure a positive voltage but from a current in the opposite direction. Other methods may be utilized to produce the same effect, such as using a bipolar power supply which would allow the A/D to have bipolar references.

The processor can be programmed with software for tracking time and one or more operational variables by continuously determining voltage, as well as the magnitude and direction of current as described above. Thus, the processor can be programmed to continuously compute one or more operational variables of the battery or battery-operated equipment such as calendar time since battery installation or since the previous service event, cumulative battery use time since battery installation or since the previous service event, number of charge cycle since battery installation or since the previous service event. The processor can be programmed to maintain this data in a database in the battery maintenance alert device of the invention.

The processor also can be programmed to compare the computed values for one or more operational variables to one or more preselected threshold values for each operational variable. The processor can be programmed to track and signal, via the feedback component, to the user of the battery or battery-operated equipment that one or more operational variables are near, have reached or have surpassed a preselected threshold value. For example, the processor can be programmed to signal the user of a battery or battery-operated equipment that the time since battery installation or since a previous service event is near a preselected threshold. The processor can be programmed to signal to the user of a battery or battery-operated equipment that a preselected period of time has passed since the battery was installed or since a previous service event. The processor can be programmed to signal to the user of a battery or battery operated equipment that battery use time since installation or since a previous service event is near a preselected threshold value or has reached or surpassed this threshold value. The processor can be programmed to signal the user of a battery or battery operated equipment that the number of charge cycle is near a preselected threshold number or that this threshold number of charge cycles has been reached or surpassed.

The processor can be programmed to receive input from the user of the battery or battery-operated equipment that relates to an installation or service event including input pertaining to the date of an installation or service event.

Voltage Regulation Component

The voltage regulation component can be coupled to the battery and used to provide a stable source of power for a device of the invention. The stable voltage provided by the voltage regulation component can be used as a reference voltage for a device of the invention. For example, the voltage of the batteries being monitored and consequently powering the invention may fluctuate as a function of load and charge. The invention utilizes a stable voltage source as power in order to protect the circuits against overvoltage, which may destroy the device, or under voltage, which would not provide sufficient energy to the circuits to function. In addition, the A/D circuits require a stable, precise and accurate voltage as a reference in order to produce reliable and consistent results for voltage and current determinations.

The voltage regulator can be, without limitation, one that generates a voltage of 3.3 V DC, 5 V DC, or a +−36 V DC.

Feedback Component

The feedback component, which is controlled by the processor, can notify the user when one or more operational variables are near, have reached or have surpassed a preselected threshold. The feedback component can notify the user using an auditory or visual signal. The auditory signal can be a continuous or pulsing sound generated by a mechanical or electrical device. The visual signal can be a flashing or non-flashing light from a lamp or light bulb. The visual signal can also be a lit text base user interface, or a graphical user interface, on a display. The auditory or visual signal can be in the form of information conveyed by a computer generated voice, as well as text information provided on a text user interface or graphical user interface.

The display can provide information pertaining to the battery to which a device of the invention is coupled. Information provided on the display can include any one or more of the following: identifying information for the battery or battery-operated equipment, date of battery installation, date of one or more service events, preselected threshold values for one or more operational variables of the battery or battery-operated equipment, and information related to one or more operational variables of the battery or battery-operated equipment as discussed herein.

The display can also provide information pertaining to servicing the battery or battery-operated equipment including instructions for battery installation and instructions for battery diagnosis, maintenance or repair. The display can also provide information including a website or telephone number through which information pertaining to a battery or battery-operated equipment including, for example, identifying information, installation information and service event information can be submitted to a remote database.

The display can also receive input from the user of the battery or battery-operated equipment. For example, the display can receive input from the user related to service event performed on the battery or battery-operated equipment. The display can be configured so that the user can input a date on which the battery or battery-operated equipment was or is to be serviced. The display can be configured so that the user can input preselected threshold values for one or more operational variables. The display can be configured to enable the user to reset the battery maintenance alert device upon battery installation or upon completion of a service event. As used herein, the term "reset" refers to an input that signals to the processor that a service event has been performed or an input that turns the feedback component off. Thus, once an installation or service event has been performed and before further use of the battery or battery-operated equipment, the user can adjust the calendar time since battery installation or since a service event to 0 or adjust the battery use time since battery installation or since a service event to 0. In addition, once an installation or service event has been performed and before further use of the battery or battery-operated equipment, the user can also adjust the preselected threshold values for one or more operational variables. By adjusting the preselected threshold values for calendar time or battery use time, the user can lengthen or shorten the period of time between battery maintenance alerts. By adjusting the preselected threshold value for charge cycle, the user can set the battery maintenance alert device to generate an alert at preselected charge cycles.

Battery maintenance Alert Process

The invention also provides a lead-acid battery maintenance alert process that involves: (1) providing an automated battery maintenance alert device of the invention, (2) providing a system for entering information into a remote database that has identifying information and associated installation and/or service event information for a plurality of batteries or battery-operated equipments, and (3) determining whether installation information, or updated service event information, for a battery or battery-operated equipment has been entered into the database by a preselected time, and (4) if the installation information, or updated service event information, has not been entered by a preselected time, then sending a notification to the user that no installation information, or updated service event information for the battery or battery-operated equipment has been entered.

The automated battery maintenance alert device of the invention is as described above. Briefly, the automated battery maintenance alert device of the invention has a database component, processor and feedback component. The automated battery maintenance alert device of the invention is capable of tracking one or more operational variables of a battery or battery-operated equipment to which the device of the invention is coupled, alerting the user when one or more operational variables has reached a preselected threshold value, and receiving input that resets one or more operational variables on the device. More specifically, the device computes one or more operational variables including calendar time, battery use time and charge cycle, compares the computed values with preselected threshold values, and if one or more computed values equal or exceed the threshold values, alerting the user to service the battery. Once an alert is sent, the device continues to track one or more operational variables and determines if (1) the user has serviced the battery and (2) if one or more operational variables exceed their preselected threshold values by predetermined amount. If the user has not serviced the battery, or if one or more operational variables has exceeded their preselected threshold values by a predetermined amount, then turning off the power to the battery operated equipment. The device can determine if the user has service the battery by determining whether the user has reset one or more operational variables or reset one or more threshold values for one or more operational variables.

The system for entering information into a remote database can be an automated telephone answering system or a web-based submission system in which identifying information, as well as installation and/or service event information for a battery or battery operated equipment can be entered. Thus, information can be entered into a remote database using a telephone or by filling out on-line form. In addition, wireless technologies such as wife, as well as Bluetooth can be used for database uploads. Identifying information is as described above. Installation information can include a date on which the battery is installed in the battery operated equipment. Service event information can include a date on which a service event such as diagnosis, maintenance or repair of the battery or battery-operated equipment is performed. Updated service event information refers to the most recent service event information existing at a select time. Service event information can also include a date on which one or more operational variables such as calendar time, battery use time or charge cycle since a previous service event are reset. As described above, the term "reset" refers to adjusting the value of one or more operational variables determined by the processor of a device of the invention to a baseline value such as 0 once an installation or service event has been performed and before further use of the battery or battery-operated equipment. For example, once a service event has been performed, battery use time or calendar time since a service event can be reset to 0. This enables the processor to determine the calendar time or battery use time since the battery was serviced.

Whether installation information, or updated service event information, for a battery or battery-operated equipment has been entered by a preselected time can be assessed using a processor programmed to determine the date by which installation information or updated service event information is due, determine whether installation information or updated service event information for a battery or battery-operated equipment has been entered by this date, and if no installation information, or updated service event information, is entered by this date, sending a notification to a user that no installation information, or updated service event information, has been entered. The preselected time can be any time after the installation information or previous service event information was entered, or any time after performance of the installation or service event itself, such as, without limitation, 25 hours, 50 hours, 75 hours, 100 hours, 200 hours, 400 hours, 30 days, 60 days, 90 days, 120 days, or 180 days after installation, after the previous service event, or after the installation information or previous service event information was entered. The preselected time can be programmed within the device.

If no installation information, or updated service event information, is entered by a preselected time, the database System could notify the user by telephone, text messaging, via email, other wireless technologies such as wife or bluetooth, or any combination thereof. Notification, for example, can be generated using an automated telephone system, automated text messaging system, an automated emailing system or any combination thereof.

The invention also provides a computerized battery maintenance alert process that involves: (1) maintaining an electronic database of identifying information and associated installation and/or service event information for a plurality of batteries or battery-operated equipments, (2) determining whether the installation information, or updated service event information, for a battery or battery-operated equipment has been entered by a preselected time, and (3) controlling a user notification system to notify the user if the installation information, or updated service event information, has not been entered at the preselected time.

Other Articles of Manufacture

The invention also provides a computer-readable medium that has computer-executable instructions for performing a method of the invention. The invention also provides a computer-readable medium that has a data structure, a first field with data representing an operational variable of a battery or battery-operated equipment, a second field with data representing a select threshold value for an operational variable, and a third field with data representing the difference between the first field and the second field.

An operational variable of a battery or battery-operated equipment, or selected threshold value for an operational variable, of a battery or battery-operated equipment are described above. The difference between the actual value and the selected threshold value can be determined by a processor. The computer-readable medium can be any form of magnetic or solid state storage for example.

Method of Providing and Selecting from a Menu

Where a battery maintenance alert device of the invention includes a text or graphical user interface as part of the feedback component, the interface can provide to the user a mechanism for entering installation or service event information such as the date of installation or date a service event was performed. Thus, through the interface, the user can select to input installation or service event information, and for each, select the month, date, year of the event. Alternatively, the interface can allow the user to reset one or more operational variables directly. More specifically, the interface can provide a menu from which the user can select to input value for one or more operational variables including calendar time, battery use time, and charge cycles, and for each of the above selection, choose a numeric value representing calendar time, battery use time and/or charge cycle. Similarly, the interface can allow the user to reset the threshold values for one or more operational variables. More specifically, the interface can provide a menu from which the user can select to input threshold values for one or more operational variables including threshold values for calendar time, battery use time, and charge cycles, and for each of the above selection, choose a numeric value representing calendar time, battery use time and/or charge cycle.

Specific embodiments of the invention are described in the following examples, which do not limit the scope of the invention described in the claims.

EXAMPLES

Example 1

Battery Maintenance Alert Device

FIG. 1 is a block diagram schematically illustrating a configuration of a battery maintenance alert device of the invention. The battery maintenance alert device 20 is coupled to battery 1 as shown. The device draws power from battery 1 to which it is coupled via voltage regulator 22 that maintains a constant voltage of 3.3 Volt. The battery maintenance alert device also has processor 30 (shaded), audible alarm 32 and a display 34. The processor includes three timers 36, 38 and 40 for tracking time and an analog-to-digital converter with channel 42 and channel 44, coupled to two resistive shunts 12 and 14 attached to each of the terminals of the battery 1 for detecting voltage and converting that analog signal to a digital signal. The processor 30 has software that uses this digital signal to compute the magnitude and direction of current generated by the battery 1. The processor 30 also has a digital port with six digital outputs: digital output 46 (bit 1) for controlling the audible alarm 32, output bit 48 (bit 2) for the chip select 50 of the display 34, digital output 52 (bit 3) for controlling the mode input 54 of the display 34, digital output 56 (bit 4) for controlling the LED backlight 58 of the display, digital outputs 60 and 62 for controlling the clock and data, respectively, to the display memory 64.

Example 2

Battery Maintenance Alert Process

Figure 2:
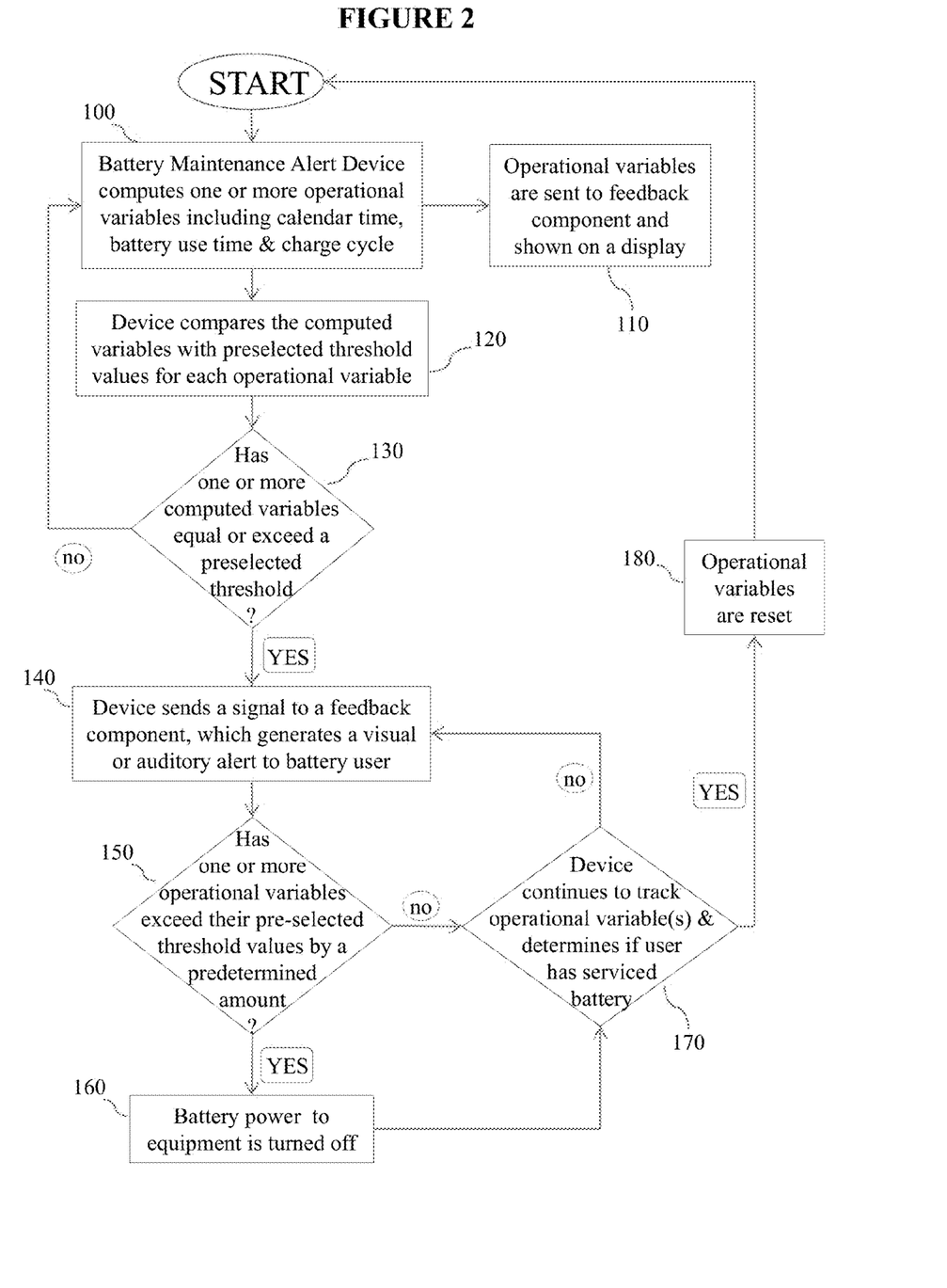
FIG. 2 is a flowchart illustrating an exemplary algorithm for monitoring and/or tracking one or more operational variables of a battery-operated equipment and alerting the user to inspect and perform maintenance on the battery.

FIG. 2 is a flow diagram depicting a portion of the operation of a battery maintenance alert device of the invention according to one embodiment of the invention. The portion shown in FIG. 2 depicts the activities performed when a device of the invention is attached to a battery. In step 100, the battery maintenance alert device computes and tracks one or more operational variables of a battery or battery-operated equipment. For example, the battery maintenance alert device tracks the passage of time, i.e. calendar time, using a timer embedded in the processor. The device also maintains a cumulative count of battery use time and charge cycle. It does so by continuously computing the magnitude and direction of current using two shunts attached to the termini of the battery and coupled to a two-channel analog-to-digital converter in the processor as described above. Battery use time is an operational variable that corresponds to a running count of time during which current discharges from the battery. Charge cycle is an operational variable that corresponds to a running count of the number of times in which the direction of current changes from discharging to charging. In step 100, the device is continuously tracking the passage of time and maintaining a cumulative count of battery discharge time and charge cycle since installation, a previous service event or the previous resetting of the device.

In step 110, the values for one or more operational variables are sent to a feedback component and provided on a display. In step 120, the battery maintenance alert device compares one or more operational variables as they are being computed by the processor with preselected threshold values for each operational variable. For example, the running count for calendar time, battery use time, or charge cycle is compared with their corresponding preselected threshold value. If none of the operational variables has reached its preselected threshold value, then the processor continues to compute and track one or more operational variables as in step 100.

In step 130, the device determines if one or more computed operational variable has reached or exceed its preselected threshold value, and if so, the processor turns on a visual or auditory signal indicating that one or more operational variable has reached its preselect threshold value and provides a method for the user to enter installation or service information into the device (step 140). If an auditory signal is generated by the device, the auditory signal can be a steady or intermittent sound. If a visual signal is generated by the device, the visual signal can be a message on a text or graphical user interface indicating that a service event is due on the battery and optionally, in combination with a light that is constantly on or intermittently on (flashing light). The message can include instructions for performing maintenance or service on the battery, instructions for resetting the battery maintenance alert device, as well as information and instructions for contacting a remote database and updating information in the database related to battery installation or service event. The message can also include an option for the user to reset the device by pressing a pre-set switch on the device per requirements that are preprogrammed into the device.

In step 150, the device continues to compute and track one or more operational variables, computes the extent to which an operational variable exceeds the preselected threshold, and determines whether an operational variable exceeds the preselected threshold by a predetermined amount, e.g. 10%. If an operational variable has exceeded the preselected threshold by this predetermined amount, then the device turns off the battery-operated equipment (step 160). If an operational variable has not exceeded the preselected threshold by this amount, then the device continues to track one or more operational variables and determines if the user has serviced the battery, for example, by determining whether the user has reset the device (step 170). Once a date for an installation or service event is entered into the database system, the user can reset one or more operational variables (step 180) and the device resumes function at step 100.

Example 3

Battery Maintenance Alert Process

Figure 3:
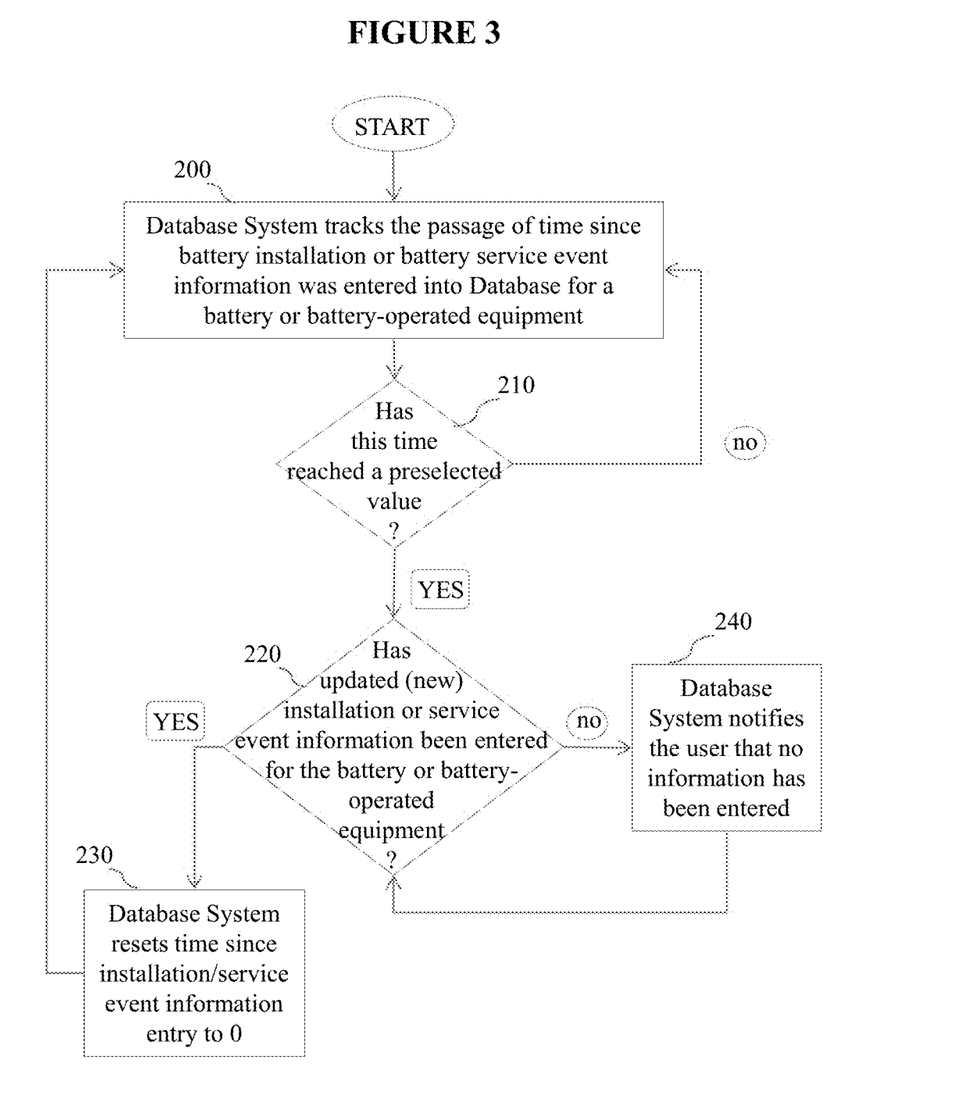
FIG. 3 is a flowchart illustrating an exemplary process by which a remote database system can be used with a battery maintenance alert device of the invention.

FIG. 3 is a flow diagram depicting the process by which a remote database system can be used to assist in battery maintenance. In Step 200, a database system tracks the passage of time since battery installation or battery service event information was entered into the database for a battery or battery-operated equipment. In step 210, the system determines if this time has reached a preselected value, and if so, the system determines in step 220, whether updated (new) installation or service event information has been entered for the battery or battery-operated equipment. If updated (new) installation or service event information has been entered for the battery or battery-operated equipment, the database system resets the time since installation/service event information entry to 0 (step 230). If no updated (new) installation or service event information has been entered for the battery or battery-operated equipment, the database notifies the user in step 240 that no information has been entered using any automated system as described above.

Example 4

Battery Maintenance Alert Process

Figure 4:
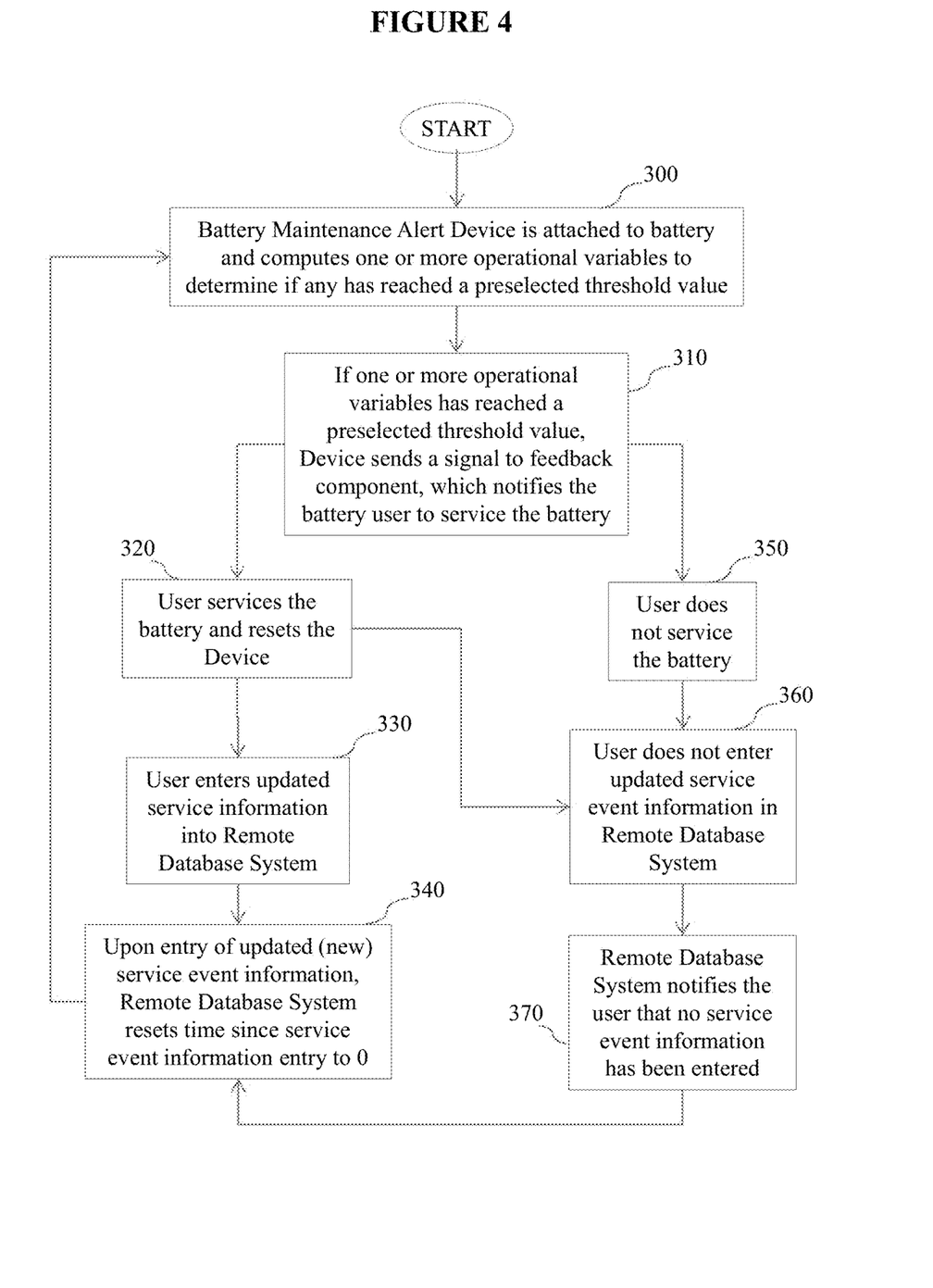
FIG. 4 is a flowchart illustrating an exemplary process by which a battery maintenance alert device of the invention functions with a remote database system to notify the user of a battery or battery-operated equipment to service the battery.

FIG. 4 is a flow diagram depicting the process by which a remote database system is used in conjunction with a battery maintenance alert device of the invention. In step 300, the battery maintenance alert device is attached to a battery and computes one or more operational variables to determine if any has reached a preselected threshold value. If one or more operational variables have reached preselected threshold values, the device sends a signal to its feedback component to notify the user that the battery or battery-operated equipment should be serviced (step 310). Once the user services the battery, the user can reset the device (step 320). In step 330, the user enters installation or updated service information into a remote database system, which triggers the remote database system to reset the time since service event information entry to 0 (step 340). If the user does not service the battery at step 350 (i.e. in response to the notification at step 310), and does not enter installation or updated service event information into the remote database at step 360, the remote database then notifies the user using any automated means described above that no installation or updated service event information has been entered (step 370).

Other Embodiments of the Invention

While the invention has been described in conjunction with the detailed description, the foregoing description is intended to illustrate and not limit the scope of the invention, which is defined by the scope of the appended claims. Other aspects, advantages, and modifications are within the scope of the following claims.

The specific methods and devices described herein are representative of preferred embodiments and are exemplary and not intended as limitations on the scope of the invention. Other objects, aspects, and embodiments will occur to those skilled in the art upon consideration of this specification, and are encompassed within the spirit of the invention as defined by the scope of the claims. It will be readily apparent to one skilled in the art that varying substitutions and modifications may be made to the invention disclosed herein without departing from the scope and spirit of the invention. The invention illustratively described herein suitably may be practiced in the absence of any element or elements, or limitation or limitations, which is not specifically disclosed herein as essential. The methods and processes illustratively described herein suitably may be practiced in differing orders of steps, and that they are not necessarily restricted to the orders of steps indicated herein or in the claims.

As used herein and in the appended claims, the singular forms "a," "an," and "the" include plural reference unless the context clearly dictates otherwise. Under no circumstances may the patent application be interpreted to be limited to the specific examples or embodiments or methods specifically disclosed herein.

The terms and expressions that have been employed are used as terms of description and not of limitation, and there is no intent in the use of such terms and expressions to exclude any equivalent of the features shown and described or portions thereof, but it is recognized that various modifications are possible within the scope of the invention as described in the statements of the invention and as claimed. Thus, it will be understood that although the present invention has been specifically disclosed by preferred embodiments and optional features, modification and variation of the concepts herein disclosed may be resorted to by those skilled in the art, and that such modifications and variations are considered to be within the scope of this invention as defined by the statements of the invention and the appended claims. In addition, the invention has been described broadly and generically herein. Each of the narrower species and subgeneric groupings falling within the generic disclosure also form part of the invention.

What is claimed is:

1. A battery maintenance alert device comprising:
   a database component operative to maintain a database containing a corresponding threshold value to each of a first, a second, and a third operational variable of a lead-acid battery supplying power, wherein the first operational variable is a calendar time, the second operational variable is a battery use time, and the third operational variable is a charge cycle count;
   a voltage detector coupled to terminals of the lead-acid battery operative to detect a current measurement;
   a processor having a timer and having an analog-to-digital converter connected to the voltage detector, said timer operative to track said first operational variable, said timer operative to periodically trigger said analog-to-digital converter to read the current measurement, and said processor operative to count said second and third operational variables according to a current magnitude and a current direction continuously computed from a current measurement signal converted from the current measurement while said voltage detector is coupled to said lead-acid battery; and
   a visual feedback component connected to said processor that is operative to produce a visual signal upon the processor determining that a value of said first, second, and third operational variables is at least near the respective threshold value of said first, second, and third operational variables, and
   an auditory feedback component under the control of said processor that is operative to produce an auditory signal upon the processor determining that the value of said first, second, and third operational variables is at least near the respective threshold value of said first, second, and third operational variables;
   wherein said visual feedback component and said auditory feedback component are not a common feedback component, and wherein said visual feedback component and said auditory feedback component are connected to said processor by separate connections.

* * * * *